(12) United States Patent
Roche

(10) Patent No.: US 7,169,686 B2
(45) Date of Patent: Jan. 30, 2007

(54) CUTTING THIN LAYER(S) FROM SEMICONDUCTOR MATERIAL(S)

(75) Inventor: Michel Roche, Dijon (FR)

(73) Assignee: S.O.I. Tec Silicon on Insulator Technologies S.A., Bernin (FR)

( * ) Notice: Subject to any disclaimer, the term of this patent is extended or adjusted under 35 U.S.C. 154(b) by 85 days.

(21) Appl. No.: 11/140,910

(22) Filed: Jun. 1, 2005

(65) Prior Publication Data
US 2005/0227456 A1 Oct. 13, 2005

Related U.S. Application Data

(60) Division of application No. 10/268,776, filed on Oct. 11, 2002, now Pat. No. 6,951,799, which is a continuation of application No. PCT/FR01/01179, filed on Apr. 17, 2001.

(30) Foreign Application Priority Data
Apr. 14, 2000 (FR) .................................. 00 05549

(51) Int. Cl.
H01L 21/78 (2006.01)
H01L 21/46 (2006.01)
H01L 21/301 (2006.01)

(52) U.S. Cl. ............... 438/460; 438/463; 257/E21.596; 257/E21.599; 216/83; 216/87

(58) Field of Classification Search ................. 438/458, 438/460
See application file for complete search history.

(56) References Cited

U.S. PATENT DOCUMENTS

| | | | |
|---|---|---|---|
| 5,374,564 A | 12/1994 | Bruel | 437/966 |
| 5,928,533 A | 7/1999 | Benea et al. | 219/121.68 |
| 6,013,563 A | 1/2000 | Henley et al. | 438/458 |
| 6,020,252 A | 2/2000 | Aspar et al. | 438/458 |
| 6,113,707 A | 9/2000 | Benea et al. | 134/1 |
| 2001/0026997 A1 * | 10/2001 | Henley et al. | 438/458 |

FOREIGN PATENT DOCUMENTS

EP 0 792 731 A2 9/1997

(Continued)

OTHER PUBLICATIONS

Kiriakopoulos et al., "Experimental and theoretical/numerical investigations of thin lins bonding strength," Theoretical and Applied Fracture Mechanics, vol. 31, No. 1, pp. 4759 (1999).

(Continued)

*Primary Examiner*—Tu-Tu Ho
(74) *Attorney, Agent, or Firm*—Winston & Strawn LLP

(57) ABSTRACT

An apparatus for cutting at least one thin layer from a substrate or ingot forming element for an electronic or optoelectronic or optical component or sensor. This apparatus includes a device for directing a pulse of energy into the substrate or forming element wherein the pulse has a duration shorter than or of the same order as that needed by a sound wave to pass through the thickness of the weakened zone, and the energy of the pulse is sufficient to cause cleavage to take place in the weakened zone as the energy of the pulse is absorbed therein. The apparatus also includes an assembly for holding or orienting the substrate or ingot forming element so that the energy pulse is completely uniformly directed over the entire surface, through the face and into the substrate or ingot forming element to cause cleavage to take place in the weakened zone as the energy of the pulse is absorbed therein.

18 Claims, 1 Drawing Sheet

FOREIGN PATENT DOCUMENTS

| | | |
|---|---|---|
| EP | 0 925 888 A1 | 6/1999 |
| EP | 0 961 312 A2 | 12/1999 |
| EP | 1 014 452 A1 | 6/2000 |
| FR | 2 666 759 A1 | 3/1992 |
| JP | 11312811 | 11/1999 |
| RU | 1324525 | 5/1992 |
| WO | WO 99/44242 A1 | 2/1999 |
| WO | WO 00/26000 A1 | 5/2000 |
| WO | WO 00/61841 A1 | 10/2000 |

OTHER PUBLICATIONS

Derwent Display Form indicating WO 99/44242 and EP 1014452 to be equivalent documents.

* cited by examiner

CUTTING THIN LAYER(S) FROM SEMICONDUCTOR MATERIAL(S)

CROSS-REFERENCE TO RELATED APPLICATIONS

This application is a division of application Ser. No. 10/268,776 filed Oct. 11, 2002, now U.S. Pat. No. 6,951,799, which is a continuation of International application No. PCT/FR01/01179 filed Apr. 17, 2001,the entire content of each of which is expressly incorporated herein by reference thereto.

BACKGROUND ART

The invention relates to cutting at least one thin layer from a substrate or ingot, in particular of semiconductor material(s), for making an electronic, optoelectronic or optical component or sensor.

In numerous applications associated with the fields of microelectronics, optoelectronics, and sensors, the technological operation of transferring a layer of one substrate onto another represents a key operation that enables numerous materials structures or specific components to be fabricated. The layer for transfer may or may not include components that are complete or in a partial state of completion.

One example of such applications is in making silicon on insulator (SOI) substrates. Typically, the insulator used is $SiO_2$ of amorphous structure on which it is not possible to deposit silicon of monocrystalline quality. One category of techniques for making such structures relies on molecular adhesion techniques referred to as "wafer bonding". These techniques are known to the person skilled in the art and in particular are described in the text "Semiconductor Wafer Bonding Science and Technology" by Q. Y. Tong and U. Gösele, a Wiley Interscience Publication, Johnson Wiley & Sons. Inc. As described in that text, using such techniques, two substrates (generally silicon substrates) are assembled together, one that is used to form the SOI layer (the "source" substrate) that is to be transferred onto the other substrate. This other substrate thus becomes the new "support" substrate that supports the SOI layer. A layer of insulation, typically of $SiO_2$ is previously formed on at least one of the faces of the substrates prior to assembly, thus obtaining a buried insulator situated beneath the SOI layer.

Certain variants are known as "bonded SOI" (BSOI) or indeed "bond etch back SOI" (BESOI). In addition to molecular adhesion, these variants rely on physically removing the source substrate either by techniques of the polishing or mechanical lapping type and/or by techniques of the chemical etching type. Other variants rely on splitting along a zone of weakness in addition to molecular adhesion on separation. These methods are described in U.S. Pat. No. 5,374,564 (or EP-A-0 533 551) and U.S. Pat. No. 6,020,252 (or EP-A-0 807 970) where splitting occurs along a weakened zone of implanted ions, or in European patent application 0 925 888, where splitting occurs through a buried layer that has been made porous.

Those layer transfer techniques present are of a generic nature since they enable structures to be made that combine various types of material with one another, and specifically that they enable structures to be obtained that are not possible to make otherwise, and in particular by deposition. Examples are monocrystalline silicon substrates on quartz, AsGa substrates on silicon, and the like.

The advantage of the methods that split along a buried fragile layer is that it is possible to make layers based on crystalline silicon (or on SiC, InP, AsGa, $LinbO_3$, $LiTaO_3$, and the like) in a range of thicknesses that extends from a few tens of angstroms (Å) to a few micrometers (µm), with very good uniformity. Even greater thicknesses are possible. other examples of applications in which layer transfer techniques can provide a suitable solution for integrating components or layers on a support that would otherwise be unsuitable for receiving such components or layers. These layer transfer techniques are also very useful when it is desired to isolate a fine layer, with or without components, from its initial substrate, e.g., by separating or eliminating the substrate.

By way of example, more and more components are expected to be integrated on supports that are different from those which enabled them to be made. By way of example, mention can In addition to making substrates, there are numerous be made of components on substrates made of plastics or on substrates that are flexible. The term "components" is used herein to mean any microelectronic device, optoelectronic device, or sensor device (e.g. a chemical, mechanical, thermal, biological, or biochemical sensor device) that is fully or partially "processed", i.e. that has been made in full or in part. In order to integrate such components on flexible supports that are otherwise incompatible with such components, it is possible to use a layer transfer method which is performed after the components have been made on a substrate which is compatible with them.

Still in the same spirit, turning a fine layer over while transferring it to another support provides engineers with a degree of freedom that is very useful for designing structures that would otherwise be impossible. Taking and turning over such thin films make it possible, for example, to make so-called "buried" structures such as buried capacitors for dynamic random access memories (DRAMs) where, contrary to the usual case, the capacitors are made first and then transferred onto another silicon substrate, after which the remainder of the circuits are fabricated on the new substrate. Another example lies in the manufactures of double gate transistors. The first gate of a CMOS transistor is made using conventional technology on one substrate, and it is then turned over and transferred onto a second substrate where the second gate of the transistor is made and the transistor is finished, thus leaving the first gate buried within the structure (see for example K. Suzuki, T. Tanaka, Y. Tosaka, H. Horie, and T. Sugii, "High speed and low power n+-p+ double gate SOI CMOS", IEICE Trans. Electron., Vol. E78-C, 1995, pp. 360–367).

An identical situation is to be found for example in the field of applications associated with telecommunications and microwaves. Under such circumstances, it is preferable for components finally to be integrated on a support presenting high resistivity, typically several kilo ohm-centimeters (kΩ·cm) at least. However a highly resistive substrate is not necessarily available at the same cost and quality as the standard substrates that are usually used. With silicon, silicon wafers having a diameter of 200 millimeters (mm) and wafers having a diameter of 300 mm are available at standard resistivity, whereas for resistivities greater than 1 kΩ·cm availability is quite inadequate at 200 mm and non-existent at 300 mm. One solution consists in making the components on standard substrates and then in transferring them during the final stages to a fine layer containing components on an insulating substrate of glass, quartz, sapphire, or the like.

From a technical point of view, these transfer operations have the major advantage of de-correlating the properties of the layer in which the components are made from those of the final support layer, and consequently they are advantageous in many other circumstances.

Relating more specifically to layer transfer techniques based on the splitting (i.e., breaking or separating) along a zone of weakness ("weakness" to be understood broadly and from a mechanical point of view) or a zone predefined to originate separation selectively (e.g., separation by chemical etching), several techniques are known concerning the step or combination that gives rise to the cut.

For example, certain combinations are based more specifically on mechanical separation (e.g., the high pressure water jet disclosed in EP 0 925 888). Certain techniques based on the so-called "lift-off" principle also enable a thin layer to be separated from the remainder of the initial support, without necessarily consuming it. Those methods generally make use of chemical etching that acts selectively on a buried intermediate layer, optionally associated with the application of mechanical forces. That type of method is in widespread use for transferring III–V elements on to various types of support (see C. Camperi et al. IEEE Transactions and Photonics Technology, Vol. 3, 12 (1991) 1123).

As another example, EP 0 925 888 describes slitting by means of a fracture along a buried layer that is made porous by mechanical means represented by a jet of water under pressure applied in the vicinity of the zone to be cut. A jet of compressed air can also be used as described in French patent application FR 2 796 491, or it is also possible to exert traction as disclosed in PCT published application WO 00/26000. It can also be appropriate to insert a blade.

Other examples rely on a zone of weakness obtained by implantation. A cut can be obtained along this zone of weakness, optionally by combining said implantation with the specific means for applying mechanical forces as mentioned above (or other such means) and/or chemical etching and/or heat treatments, etc. A few examples of such techniques are to be found in documents U.S. Pat. No. 5,374,564 (or EP-A-0 533 551) and U.S. Pat. No. 6,020,252 (or EP-A-0 807 970), and PCT published application WO 00/61841.

Numerous means can be adopted to trigger or assist splitting along a zone of weakness. U.S. Pat. Nos. 6,020,252 and 6,013,563 and European patent applications 0 961 312 and 1 014 452 provide more detailed explanations of, for example, mechanical forces in tension, in shear, in twisting, heat treatments using a wide variety of hot or cold sources of heat (conventional ovens, light means, lasers, electromagnetic fields, electron beams, cryogenic fluids, etc.), laser ablation of an intermediate layer, and the like.

The layer transfer techniques mentioned in the introduction nevertheless present certain specific drawbacks.

Techniques based on thinning down (mechanically, chemically, etc.) suffer from the drawback of consuming and sacrificing a substrate, which is inefficient from an economic standpoint. Such thinning techniques are also often quite difficult and expensive to implement.

Combinations based on applying external mechanical stresses (shear, twisting, bending, tension, and the like) suffer from the drawback of generally requiring adhesion (molecular or otherwise) that is sufficiently strong to avoid breaking under the stress needed for rupturing the weak zone. A method for obtaining such adhesion is not always available in certain manufacturing methods or applications which are subject to very severe specifications (e.g., where it is impossible to heat, impossible to use specific solvents or other chemicals, impossible to apply traction to the structure because of the risk of destroying sensitive components, etc.).

In certain applications, techniques based on annealing and other heat treatments come up against incompatibility with the step of raising temperature, e.g., the temperature of the final support on which the layer is to be integrated. For example, the new support may not be capable of withstanding the temperatures required. This generally applies to plastic materials. By way of another example, the incompatibility can stem from the combination of materials, in particular because they have too great a difference in thermal expansion coefficients which would cause an assembly that is not sufficiently uniform to break during a temperature rise. This would apply for example to a structure that combines silicon and quartz.

Techniques based on chemical etching are aggressive and this can make them incompatible with the final support on which the layer for transfer is to be integrated, or with components that might already be present on that layer.

Among other combinations, U.S. Pat. No. 6,013,563 and European patent application 1 014 452 describe or mention techniques based on applying beams of light and/or electrons. U.S. Pat. No. 6,013,563 refers to applying a beam of photons and/or electrons in order to heat the structure, while EP 1 014 452 describes a method in which an arbitrary source of photons (X rays, UV light, visible light, infrared light, microwaves, lasers, etc.) is suitable for giving rise to separation. The implementation described when using a laser, for example, refers to laser ablation of the intermediate layer which leads the authors to prefer using laser pulses of relatively high power ("preferably for energy densities lying in the range 100 millijoules per square centimeter ($mJ/cm^3$) and 500 $mJ/cm^3$") and of relatively long duration ("preferably for durations lying in the range 1 nanosecond (ns) to 1000 ns, and especially for durations lying in the range 10 ns to 100 ns"). The authors also state that that method of implementation requiring relatively large amounts of energy to be delivered in order to operate suffers from the drawback of possibly damaging the layer that is to be transferred.

Thus there is a need for further manufacturing processes that do not possess the disadvantages of the prior art.

SUMMARY OF THE INVENTION

The present invention provides a new method of cutting a semiconductor material along a zone of weakness which does not rely on raising temperature, chemical etching or decomposing the layer of weakness (whether by ablation or otherwise). In this method, a layer of weakness is cut by injecting a pulse of energy into the substrate so as to generate a sound wave of amplitude suitable for causing cleavage to take place in the layer of weakness.

The invention specifically relates to a method of cutting at least one thin layer from a substrate or ingot forming element for an electronic, optoelectronic or optical component or sensor. This method comprises forming a weakened zone in the substrate or ingot forming element, wherein the weakened zone has a thickness that corresponds to that of the layer that is to be removed; and generating and directing a pulse of energy into the substrate or forming element wherein the pulse has a duration shorter than or of the same order as that needed by a sound wave to pass through the thickness of the weakened zone. The energy of the pulse is sufficient to cause cleavage to take place in the weakened zone as the energy of the pulse is absorbed therein.

In this method, the weakened zone can be a porous zone, in particular, one formed by deposition or by implantation. When implantation is used, the implantation is of phosphorus, arsenic, protons, or rare gas ions. Also, the substrate or ingot forming element advantageously comprises semiconductor material(s), $LiNbO_3$, $LiTaO_3$, or a composite material thereof. Especially preferred are Silicon, SiC, GaAs, InP, GaN, SiGe, Ge, $LiNbO_3$, $LiTaO_3$, or a composite material thereof.

After the weakened zone forming step, the substrate or ingot forming element is generally bonded onto a support to form a block. When this is done, the energy pulse is directed into the block. The block can be formed by bonding the substrate or ingot forming element onto the support by molecular adhesion bonding or by adhesive bonding. If desired, the block can include a layer of $SiO_2$, $Si_3N_4$, or a combination thereof.

The energy pulse is preferably generated by a laser beam, although it also can be a beam of electrons. The energy pulse is of short duration so as to not cause heating of the block. Generally, a duration of less than 1 ns is used. The energy pulse may be a single pulse or repeated multiple times, as necessary to cause cutting of the layer.

In one embodiment, the substrate or ingot forming element has a polished face and the energy pulse is directed through that face and into the substrate or ingot forming element. When implantation is used to provide a weakened zone, the energy pulse can be directed into the substrate or ingot forming element through the same face as the implanted ions, or through a second face that is on an opposite side of the substrate or ingot forming element.

In a preferred embodiment, the energy pulse is directed to be selectively absorbed directly on the weakened zone. The substrate or ingot forming element can be doped so that the energy pulse is selectively absorbed in the weakened zone. If so, the doping preferably includes ionically implanting phosphorus or arsenic into the substrate or ingot forming element. The selective absorption can be performed in a metal layer, or within a deposited layer. Typically, the selective absorption is obtained within a layer whose properties have been modified by implantation.

The energy pulse may be directed onto the substrate or ingot forming element after all or part of a component of an electronic, optoelectronic or optical component or sensor has been made.

In this regard, the invention also relates to a method of making an electronic or optoelectronic or optical component or sensor which includes a method of cutting at least one thin layer from a substrate or ingot forming element according to the methods disclosed herein.

The invention also relates to an apparatus for carrying out these methods. This apparatus comprises means for generating and directing a pulse of energy into the substrate or forming element wherein the pulse has a duration shorter than or of the same order as that needed by a sound wave to pass through the thickness of the weakened zone, and the energy of the pulse is sufficient to cause cleavage to take place in the weakened zone as the energy of the pulse is absorbed therein.

The energy pulse generating means preferably comprises a YAG or a neodymium-doped glass laser suitable for delivering pulses that have a duration of less than 1 ns. It may comprise a laser or a sheet of solid lasers, or a pulsed diode type pulse accelerator for delivering a beam of electrons that have a duration of less than 1 ns.

BRIEF DESCRIPTION OF THE DRAWING FIGURES

The characteristics and advantages of the invention appear better from the following description referring to the accompanying figures in which.

DETAILED DESCRIPTION OF THE PREFERRED EMBODIMENTS

In a preferred first implementation of the invention, the procedure is as follows. The starting material is a semiconductor wafer, e.g. of silicon 2 (see FIG. 1) having a thickness of about 500 µm, which is polished on one of its faces 1. Protons are implanted in its face at an energy such that their penetration depth into the semiconductor is a little greater than the thickness λ of the thin layer of semiconductor that is to be made. For example, to make a layer that is about 1 µm thick, protons are used at an energy of about 150 kilo-electon volts (keV).

Figure 1:
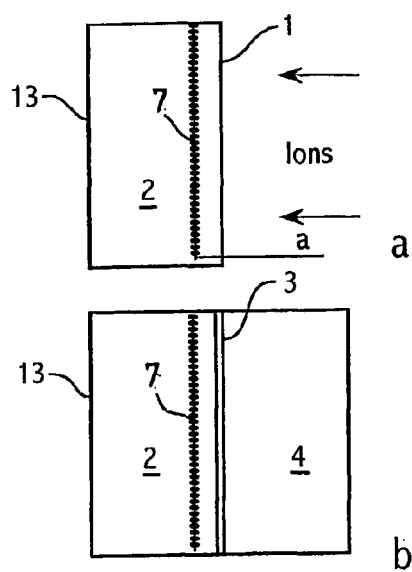
FIGS. 1a and 1b are cross-sectional views taken through the set of semiconductor and insulating substrates after implantation (FIG. 1a) and bonding (FIG. 1b)

Thereafter, an insulating substrate 4 is prepared, and in the example shown in FIG. 1 this is a substrate of silicon covered in a layer of $SiO_2$ having a typical thickness of a few tenths of a micrometer.

Thereafter, the substrates (4 and 2) are bonded together by molecular adhesion using a method that is now well known (see for example the text "Semiconductor wafer bonding Science and Technology" by Q. Y. Tong and U. Gösele, a Wiley Interscience Publication, Johnson Wiley & Sons. Inc.).

This produces the block shown in FIG. 1b. This block is then impulse heated from the free surface of the semiconductor wafer 2, i.e., the face 13 shown in FIG. 1b. The purpose of the heating is to raise the pressure in the thickness $\epsilon_0$ affected by the heating, with this being necessary in order to generate the sound wave that is to be used for breaking the implanted layer 7 that is weakened by implantation or by any other means. To heat the layer of thickness $\epsilon_0$ beneath the surface 13, it is necessary to implement or come close to implementing "constant volume heating" conditions. Heating causes expansion, but this can occur only in the form of a sound wave propagating at the speed of sound. If the heating is performed at a time t that is shorter than the time taken by the sound wave to pass through half the thickness of the heated layer (of thickness equal to $\epsilon_0$), it will readily be understood that the center of this layer will not be able to expand throughout the duration of the heating. Heating is thus performed at "constant volume", providing the following relationship is complied with, where C is the speed of sound:

$$t < \frac{\varepsilon_0}{2C}$$

The orders of magnitude implied by this relationship are dominated by the need to implement a sound wave that is very short in three-dimensional space.

Specifically, it is deemed that this is satisfied when the duration of the energy pulse is less than or of the same order as the duration needed by a sound wave to pass through the thickness of the zone that absorbs the energy of the pulse. This pulse has the requisite energy to cause cleavage to take place in the weakened zone.

In order to ensure that the rupture mechanism is effective, it is necessary for $\varepsilon_0$ to be of the same order of magnitude as the thickness $\lambda$ of the layer that is to be detached, which is of micrometer order. It is also known that in a semiconductor, e.g., silicon, the speed of sound is about $2 \times 10^3$ meters per second (m.s$^{-1}$). The above relationship thus indicates that the duration of the pulse must be of the same order as or shorter than 1 ns, and preferably less than 0.5 ns, which is extremely brief but which can be achieved using special lasers or electron beams.

Once the above conditions are satisfied, the amplitude $\Delta P$ of the sound wave in compression or in expansion can be expressed by the Grüneisen relation:

$$\Delta P = \frac{1}{2} \Gamma \cdot \rho \cdot \frac{dE}{dm}$$

where:
$\Gamma$ is the Grüneisen constant which for silicon is about 1.5;
$\rho$ is the density of the medium and is about $2.5 \times 10^3$ (S.I. units);

$$\frac{dE}{dm}$$

is the variation in the specific internal energy of the medium. It is equal to the impulse heating per unit mass.

By way of example, it is assumed that the impulse heating gives rise to a temperature rise $\Delta\theta = 75°$ C. in silicon having specific heat of 0.75 joules per gram, which gives:

$$\frac{dE}{dm} = 5.62 \times 10^4 \text{ (S.I. units)}.$$

Inserting these values into the above equation, it is found that a typical pressure is 105 megapascals (MPa), or in other words 1.05 kilobars (kbar). It should be observed that this wave amplitude, when implemented in the form of expansion, is of the same order of magnitude as the cohesion strength of the material, and that it is therefore designed to break the layer that is weakened by ion implantation. Finally, it should be observed that such a high pressure is obtained merely by a modest temperature rise of 75° C. at the point where the energy is deposited, and that as soon as this energy disperses into the thickness of the substrate, the temperature rise becomes less than 1° C. It is thus genuinely possible to speak of a "cold" method of delamination, i.e., one that does not cause any appreciable heating of or damage to the material.

Figure 2:
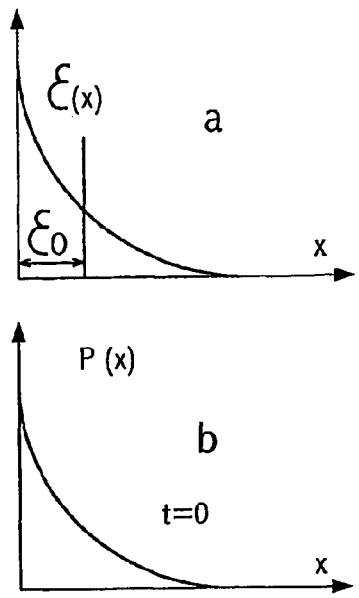
FIGS. 2a and 2b are graphs showing the relationship for energy deposited in the material when the energy is deposited with a laser.

The sound waveform depends on how the deposited energy is distributed in the material. If it were possible to deposit the energy in zero time and if its distribution $\epsilon(x)$ as a function of depth $\underline{x}$ in the semiconductor (2) were of exponential appearance as shown diagrammatically in FIG. 2a, then at the instant the pressure would be P(x) as represented by the curve shown in FIG. 2b. In reality, the distribution Po(x) is deformed by the prorogation of expansion throughout the duration of deposition, and is never instantaneous.

Figure 3:
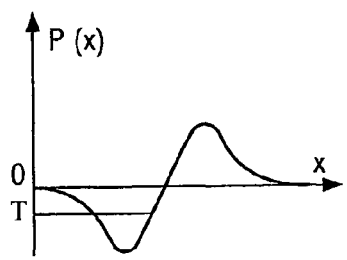
FIG. 3 is a graph that shows a sound wave at a given instant in the form of a curve P(x)
Figure 4:
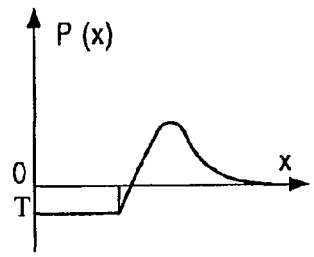
FIG. 4 is a graph that shows the sound wave behind a break in material in the form of the relationship P(x)

This initial pressure splits into two waves, one going rearwards (in the increasing $\underline{x}$ direction) and the other going in the opposite direction, reflecting on the free face, and then also travelling rearwards, but this time in the form of an expansion wave. FIG. 3 shows the complete wave at a given instant during its propagation through wafer 2. It will be observed that the total impulse, i.e., the area beneath the curve, is zero, which is necessary since the laser or electron beam responsible for the heating is of quasi-zero impulse. When the expansion wave reaches the implanted layer whose breaking stress is assumed to be T, then the wave as transmitted downstream is truncated, as shown in FIG. 4. Thus, the impulse received by layer 2 and by its support 4 is not zero, causing the mass to be ejected at low speed.

There follows an examination of how the face 13 is impulse heated. It is shown above that the heated thickness should be about 1 μm, corresponding to a mass of material of about $2.5 \times 10^{-4}$ grams per square centimeter (g/cm$^2$). Thus, in order to achieve the above-mentioned impulse temperature rise of 75° C., it is necessary for the energy density of the beam to be about $1.87 \times 10^{-4}$ J/cm$^2$. This ideal energy is very weak. In order to separate a layer from a wafer of 300 mm diameter, it would suffice for the laser pulse or electron beam to have energy of 0.13 J.

In reality, it is necessary to use much higher energy because of the expansion which occurs while energy is being deposited and also because absorption does not take place in ideal manner, i.e., it includes a distribution tail which is ineffective in raising pressure. In practice, the energy needed to separate a wafer over 300 mm diameter is about 13 joules.

Figure 5:
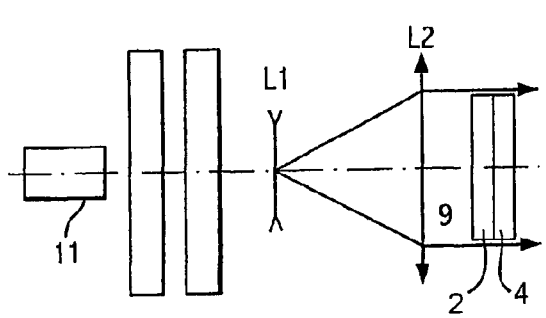
FIG. 5 illustrates an apparatus for depositing energy by laser pulse.
Figure 6:
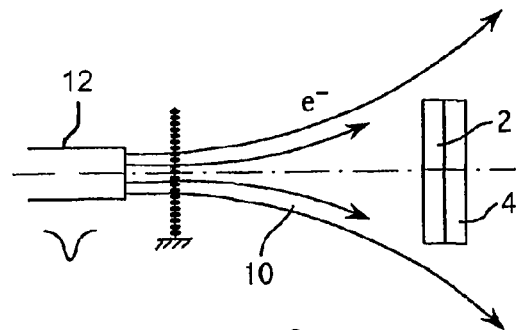
FIG. 6 illustrates an apparatus for depositing energy when using an electron beam to heat the surface layer of a semiconductor substrate.

In order to deposit the required energy in the surface 13, it is possible either to use a very short pulse laser such as a yttrium aluminum garnet (YAG) laser, for example, using one or two stages of amplification and a Q-switched pilot 11 with wavefront steeping by saturable plates so as to achieve pulses of 0.1 ns to 1 ns duration. For higher energies per pulse, the final stages of amplification may be made of neodymium glass. A setup of the type shown in FIG. 5 is then obtained. A system of lenses L1, L2 serves to apodize and expand the beam 9 so that the energy density is completely uniform over the entire surface 13 whose diameter can be as great as 300 mm using present-day technology. FIG. 6 illustrates the use of a grid to expand the beam to cover the entire surface of the substrate.

Once the apparatus has been set up, the laser beam having a wavelength close to 1.06 μm must be coupled with the semiconductor constituting the substrate 2. When this semiconductor is made of silicon, if the 1.06 μm beam were to be used directly, then absorption would take place over a mean thickness of about 100 μm, which is much too great. In order to reduce the thickness of the energy deposition, it is necessary to increase the absorption of the medium 2. This can be done by:

1) doubling, tripling, quadrupling the frequency of the laser beam using the now well known techniques based on non-linear effect plates;

2) surface doping, e.g. by tonically implanting phosphorus or arsenic in order to reduce resistivity and thus increase absorption of the material at 1 µm wavelength;

3) depositing a thin absorbent layer on the face 13, e.g. a metal layer having at thickness of 1 µm.

To deposit the energy, it is also possible to use a pulsed electron beam (10, see FIG. 6) obtained using a pulse diode 12. To ensure that penetration in layer 2 is on the order of 1 µm, the energy of the electrons needs to be limited to about 30 keV. For a surface of 300 mm diameter, in order to deposit energy of about 3 joules, and taking account of the better absorption by layer 2, the current delivered to the diode should be 150 kiloamps (kA), which is easily achievable.

In another preferred implementation of the invention, given by way of non-limiting indication, energy is deposited by means of a 1.06 µm laser beam as described above directly into the implanted layer 7 where it is desired to cause splitting or fracture. The description relates to the case where the semiconductor 2 is constituted by silicon. Given that silicon is rather transparent at the YAG wavelength, it is possible to reach the layer 7 in the center of the stack 2,4 by illuminating either face 13 or the opposite face of the structure. Advantage is taken of the implanted layer being naturally much more highly absorbent than the initial crystal, even when implantation is performed using protons. It is also possible to increase its absorption strongly by implanting ions of phosphorus or of arsenic or of any other suitable element. It should be observed that under such circumstances, the expansion wave created is about twice that obtained in the preceding case, other parameters remaining identical. Furthermore, implementation is simplified since it is no longer necessary to ensure that the layer where the energy is deposited is parallel with the implanted layer since they are now the same layer. This disposition also presents the advantage of not requiring the bonding operation whose traction strength must be very high. Each of the two portions that result from cleaving the implanted layer 7 receives a clean impulse. In other words, the bonded interface 3 is subjected only to a compression wave, providing that the face opposite to the surface 13 has deposited thereon a mechanically matching medium that enables the compression sound wave to be received so that it does not reflect in expansion from that face. This medium or damper can be constituted by a plate of silica having a thickness of 10 mm or 20 mm and which is permanently or temporarily bonded to the face opposite to face 13.

The invention can be used for industrial manufacture of a substrate of the SOI type.

What is claimed is:

1. An apparatus for cutting at least one thin layer from a substrate or ingot forming element for an electronic, optoelectronic or optical component or sensor, wherein the substrate or ingot forming element includes a face and a weakened zone oriented substantially parallel thereto, with the weakened zone having a thickness that corresponds to that of the thin layer that is to be removed, the apparatus comprising means for generating a pulse of energy into the substrate or forming element wherein the pulse has a duration shorter than or of the same order as that needed by a sound wave to pass through the thickness of the weakened zone, and the energy of the pulse is sufficient to cause cleavage to take place in the weakened zone as the energy of the pulse is absorbed therein; and means for directing the energy pulse completely uniformly over the entire surface, through the face and into the substrate or ingot forming element to cause cleavage to take place in the weakened zone as the energy of the pulse is absorbed therein.

2. The apparatus according to claim 1, wherein the energy pulse includes a beam of electrons.

3. The apparatus according to claim 2, wherein the directing means comprises a system of lenses for directing the beam over the entire surface of the substrate or ingot forming element.

4. The apparatus according to claim 3, wherein the system of lenses serves to apodize and expand the beam to apply an energy density that is completely uniform over the entire surface of the substrate or ingot forming element.

5. The apparatus according to claim 2, wherein the generating means includes a pulsed diode type pulse accelerator for delivering a beam of electrons that have a duration of less than 1 ns.

6. The apparatus according to claim 2, wherein the directing means comprises a grid which expands the beam to cover the entire surface of the substrate.

7. The apparatus according to claim 1, wherein the generating means comprises a laser.

8. The apparatus according to claim 1, wherein the generating means comprises a YAG or a neodymium-doped glass laser suitable for delivering pulses that have a duration of less than 1 ns.

9. The apparatus according to claim 1, wherein the generating means comprises a sheet of solid lasers.

10. The apparatus according to claim 1, wherein the substrate or ingot forming element is bonded onto a support to form a block and the directing means is configured to direct the energy pulse into the block.

11. The apparatus according to claim 1, wherein the energy pulse of the generating means is a single pulse.

12. The apparatus according to claim 1, wherein the generating means repeats the energy pulse multiple times.

13. The apparatus according to claim 1, wherein the substrate or ingot forming element comprises semiconductor material(s), $LiNbO_3$, $LiTaO_3$, or a composite material thereof.

14. The apparatus according to claim 13, wherein the substrate or ingot forming element comprises silicon, SiC, GaAs, InP, GaN, SiGe, Ge, $LiNbO_3$, $LiTaO_3$, or a composite material thereof.

15. The apparatus according to claim 1, wherein the weakened zone is a porous zone.

16. The apparatus according to claim 1, wherein the weakened zone is formed by deposition.

17. The apparatus according to claim 1, wherein the weakened zone is formed by implantation.

18. The apparatus according to claim 17, wherein the implantation is of phosphorus, arsenic, protons, or rare gas ions.

* * * * *